United States Patent
Yang et al.

(10) Patent No.: US 9,431,982 B1
(45) Date of Patent: Aug. 30, 2016

(54) LOUDNESS LEARNING AND BALANCING SYSTEM

(71) Applicant: Amazon Technologies, Inc., Seattle, WA (US)

(72) Inventors: Jun Yang, San Jose, CA (US); Philip Ryan Hilmes, San Jose, CA (US); Chad Georges Seguin, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 14/672,293

(22) Filed: Mar. 30, 2015

(51) Int. Cl.
*H03G 3/20* (2006.01)

(52) U.S. Cl.
CPC ...................... *H03G 3/20* (2013.01)

(58) Field of Classification Search
None
See application file for complete search history.

(56) References Cited

U.S. PATENT DOCUMENTS

| | | | |
|---|---|---|---|
| 2009/0016547 A1* | 1/2009 | Aoki | H03G 3/02 381/107 |
| 2013/0136277 A1* | 5/2013 | Sudo | H03G 3/3089 381/107 |

* cited by examiner

*Primary Examiner* — Wayne Young
*Assistant Examiner* — Mark Fischer
(74) *Attorney, Agent, or Firm* — Seyfarth Shaw LLP; Ilan N. Barzilay; David A. Klein (57) ABSTRACT

A loudness learning and balancing system for one or more audio channels. The system learns user volume preferences from manual interventions, providing effective and robust loudness learning to provide a consistent and balanced sonic experience. The system also reduces and/or eliminates incorrect attenuation or over-amplification of quiet interludes in the audio material, thereby eliminating artifacts such as noise pumping or breathing. In addition, the system reduces low level noise in the audio signals while preserving a wide dynamic range at most listening levels.

20 Claims, 7 Drawing Sheets

LOUDNESS LEARNING AND BALANCING SYSTEM

BACKGROUND

In audio rendering and reproduction systems, differences in audio material may result in large level changes, such as different recordings having different dynamic ranges, or differences in levels with a song itself, and differences in levels between different content providers (e.g., one radio station to another).

BRIEF DESCRIPTION OF DRAWINGS

For a more complete understanding of the present disclosure, reference is now made to the following description taken in conjunction with the accompanying drawings.

DETAILED DESCRIPTION

A long-standing goal of audio device designers has been to provide users with a consistent sonic experience without the need for manual intervention to adjust the audio output volume of the device, as most listeners would prefer a consistent and balanced loudness experience regardless of the level changes that occur in the audio material.

"Loudness" is a characteristic of a sound that is primarily a psychological correlate of physical strength of the sound (i.e., perceived amplitude). More formally, it may be defined as "that attribute of auditory sensation in terms of which sounds can be ordered on a scale extending from quiet to loud." Loudness is a subjective measure, as compared to objective measures of sound strength/energy such as sound pressure, sound pressure level (in decibels), sound intensity, or sound power. Loudness is also affected by parameters other than objective sound strength/energy, including frequency, bandwidth and duration.

In general, the subjective strength/energy of a sound is proportional to the subjective strength/energy represented in an audio signal used to record or reproduce the sound, such that the subjective strength/energy of a sound and the subjective strength/energy of the corresponding audio signal are interchangeable.

As an example of how loudness levels can relate to objective measures of sound strength, consider a volume control of a sound system that has linear characteristics (e.g., a 10% increase in volume raises the sound power/pressure by 10%). Adjusting the volume control to reduce the energy levels of the sound by 75% (corresponding to a reduction in signal power/pressure by 75%) will produce a proportional "actual" objective reduction of output energy to one-quarter of the former energy, but may result in a "perceived" subjective reduction of loudness that is more than 75% (e.g., that the loudness is perceived to be 10% of the former energy, even though it is actually 25%). Likewise, adjusting the volume control to increase the energy levels of reproduced sound by 100% may produce an "actual" objective increase of energy that is twice the former energy, but result in a "perceived" subjective increase in loudness that is even larger (e.g., the loudness is now perceived to be 250% of the former energy, even though it is actually 200%).

One approach to providing consistent audio levels has been to add Dynamic Range Compression (DRC) and a limiter to audio recording and reproduction equipment to reduce the dynamic range of the audio material. DRC reduces the volume of loud sounds and amplifies quiet sounds by narrowing or "compressing" an audio signal's dynamic range. A "limiter" is a circuit or process that allows signals below a specified threshold input power to pass unaffected while attenuating the peaks of stronger signals that exceed this threshold input power. Signals that exceed the specified threshold input power may "saturate" downstream components, overloading the components and producing audible "pops" and harmonic distortion.

Dynamic Range Compression (DRC) may be used for downward compression to reduce loud sounds over a certain threshold while quiet sounds remain unaffected. DRC may also be used for upward compression to increase the loudness of sounds below a threshold while leaving louder passages unchanged. Both downward and upward compression reduce the dynamic range of an audio signal, where the dynamic range corresponds to a range between the softest sounds and the loudest sounds.

Dynamic Range Compression (DRC) and a limiter may be used to reduce the signal levels of the higher peaks while leaving the quieter passages of the audio material unaltered. Although DRC and limiters are used extensively in audio recording, production work, broadcasting, and live performance applications, conventional DRC and limiter techniques do not learn from a user interventions to adjust volume, as those interventions are an indication of a user's preferred loudness.

Conventional DRC systems also do not detect the silence and noise in the reproduced signal, which can result in application to upward compression of noise in the signal during silences and over-amplification of quiet interludes. In most audio recordings, inaudible background noises may be captured, as well as electronic noise introduced by the microphone(s) and recording electronics, noise introduced by the conversion and storage of the audio recording on the recording media, noise introduced in the recovery and reproduction of the audio recording from the recording media, etc. This cumulative noise may be of little consequence during normal and loud passages of a recording, but these noises will dominate the unfiltered/unprocessed audio signal (i.e., the "raw" audio signal) during periods of "silence." The combined noises tend to have consistent level, with the sum of all noise sources and unwanted signals in the system referred to as a "noise floor."

As a conventional DRC system will apply upward compression to the raw audio signal when the signal is below a threshold energy, background sounds may be indiscriminately attenuated or boosted in an unnatural way. A noticeable rise of the noise floor is called "breathing," while a sudden and usually unwanted deep gain reduction of audible audio is called "pumping."

Ideally, audio recording and reproduction system would learn a user's preferred loudness so as to avoid the need for the user to have to intervene and manually adjust the up-and-down volume of a device so as to maintain a consistent level above the noise floor. It is also desirable to maintain a wide dynamic range to more accurately reproduce the original audio material.

Figure 1:
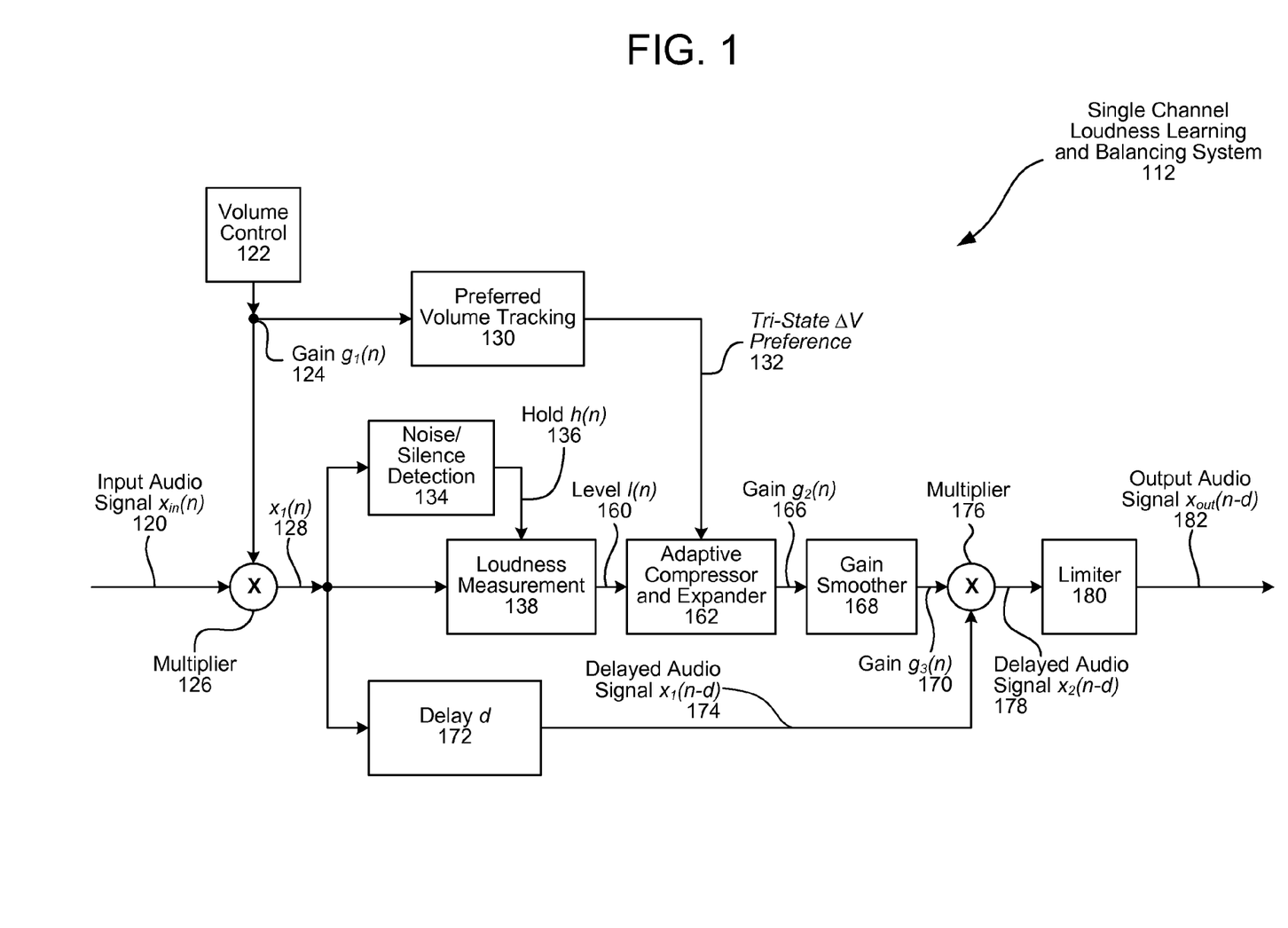
FIG. 1 is a block diagram conceptually illustrating an example of a loudness learning and balancing system for a single audio channel.

FIG. 1 is a block diagram conceptually illustrating an example of a loudness learning and balancing system 112 for a single audio channel. The system 112 learns volume preferences from a user's manual interventions or other volume-preference sources, providing effective and robust loudness learning to provide a consistent and balanced sonic experience. The disclosed adaptive compressor and expander 162 of the system 112 under the control of a noise and silence detection element 134 also reduces and/or eliminates incorrect attenuation or over-amplification of the noise floor during quiet interludes and silences in the audio material so as to maintain a consistent level of noise and the integrity of silent periods, minimizing "breathing." The disclosed noise and silence detection element 134 also indicates to the provides the system 112 an indication when the audio signal contains content so as to accurately estimate the loudness of the audio and minimize "pumping." The system 112 reduces low level noise in the audio signals while preserving a wide dynamic range at most listening levels.

Unless otherwise stated, the audio signals in the system 112 may be analog, digital, or a mix thereof (e.g., some stages analog and some stages digital). Likewise, the processing components of the system 112 may be analog circuits, digital circuits, digital-signal processing routines executed by a general-purpose computer or digital signal processor (DSP), or some combination thereof. If the system mixes analog and digital, analog-to-digital converters and/or digital-to-analog converters may be included at the various stages, as known in the art.

Conceptually, the system 112 comprises six main sections: noise and silence detection, silence detection-controlled loudness measurement, preferred volume tracking, preferred volume-controlled adaptive compression and expansion, adaptive gain smoothing, and peak limiting.

When a user chooses to listen to audio content, they will typically spend a few seconds adjusting the volume level when the content first starts to play to meet their desired sound pressure level (SPL). The user controls the volume using volume control 122, which may be most any user interface, such as up-and-down volume buttons (e.g., physical buttons, virtual buttons displayed on a touch-sensitive user interface, etc.), a rotary knob (e.g., an analog rotary potentiometer, an optical rotary encoder, a virtual knob displayed on a touch-sensitive user interface, etc.), a volume slider, a speech-recognition-based spoken command to adjust the volume level, etc. As an alternative to a user interface, the volume control 122 may be part of a subsystem or device that sets and adjusts a volume automatically, such as an arrangement where an estimate of the physical distance to a user is used to adjust the volume.

The volume level is output by the volume control 122 as a gain $g_1(n)$ 124, where "n" corresponds to time, such as a time of a signal sample in the analog domain or a discrete time in the digital domain. The volume level (as a gain $g_1(n)$ 124) is applied to an input audio signal $x_{in}(n)$ 120 by a multiplier 126, producing an audio signal $x_1(n)$ 128 having the adjusted volume. Examples of the multiplier 126 (and other multipliers referred to herein) include a physical amplification circuit such as an operational amplifier ("op-amp") based circuit, a software-based gain stage applied to a digital audio signal by digital signal processing, etc.

A change in gain $g_1(n)$ 124 indicates an intervention or instruction to change the volume level. A preferred volume tracking block 130 monitors the gain $g_1(n)$ 124 and memorizes changes ("ΔV"). A change of volume level that is positive (i.e., a positive ΔV) indicates that the user is likely want to listen to louder content. A change of volume level that is negative (i.e., a negative ΔV) indicates that the user is likely to want to listen to softer content. No change in volume (i.e., ΔV equals zero) indicates that the user is likely to want like to listen with the current loudness.

The preferred volume tracking block 130 is a digital-domain block that extracts and buffers a history of gain change values, applies a learning algorithm to the extracted volume change information, and outputs a tri-state value 132 to an adaptive compressor and expander block 162, which will be described further below. The output 132 of the preferred volume tracking block 130 is a three-state preference value which denotes whether the preference has been to "to increase volume" (+1), "to decrease volume" (−1), and "do not change volume" (0).

An example of robust implementation of block 130 is to store the input volume gain value into a circular data buffer with size N (e.g., N=4). Based on the information contained in consecutive buffered N values of $g_1(n)$, $g1(n-1)$, $g_1(n-2)$ . . . $g_1(n-N+1)$ in terms of values and time index, (N−1) volume differences (ΔV values) are obtained: values $g_1(n)-g_1(n-1)$, $g_1(n-1)-g_1(n-2)$ . . . and $g_1(n-N+2)-g_1(n-N+1)$. If there are more positive ΔV values than negative ΔV values after this extraction of the stored gain values, the block 130 outputs a ΔV preference value 132 of +1. If there are less positive ΔV values than negative ΔV values, the block 130 outputs a ΔV preference value 132 of −1. Otherwise, the block 130 outputs a ΔV preference value 132 of 0 (e.g., as default value and if there are a same number of positive and negative difference values). As an example of a further refinement of a robust implementation of block 130, the output tri-state ΔV preference value 132 may be based on both the ΔV values and the changes of ΔV values.

As illustrated in FIG. 1 and as explained further below, while the gain $g_1(n)$ 124 set by the volume control 122 is applied to the raw audio signal $x_{in}(n)$ 120 (via pre-amplifier multiplier 126), the preferences underlying how the ΔV preference value 132 is set are used to determine how the system modifies loudness levels. A consequence of this trend-learning algorithm is that a user may increase the volume (via control 122), increasing the gain $g_1$ at time "n" from the gain at time "n−1," but the ΔV preference value 132 used to configure subjective loudness is set to "−1" (i.e., decrease volume") or "0" (i.e., do not change volume) due to overall trends based on the buffered values indicating a different outcome. Likewise, a user may decrease the volume (via control 122), decreasing the gain $g_1$ at time "n" from the gain at time "n−1," but the ΔV preference value 132 is set to "1" (i.e., increase volume") or "0" (i.e., do not change volume) due to overall trends based on the buffered values.

Figure 2:
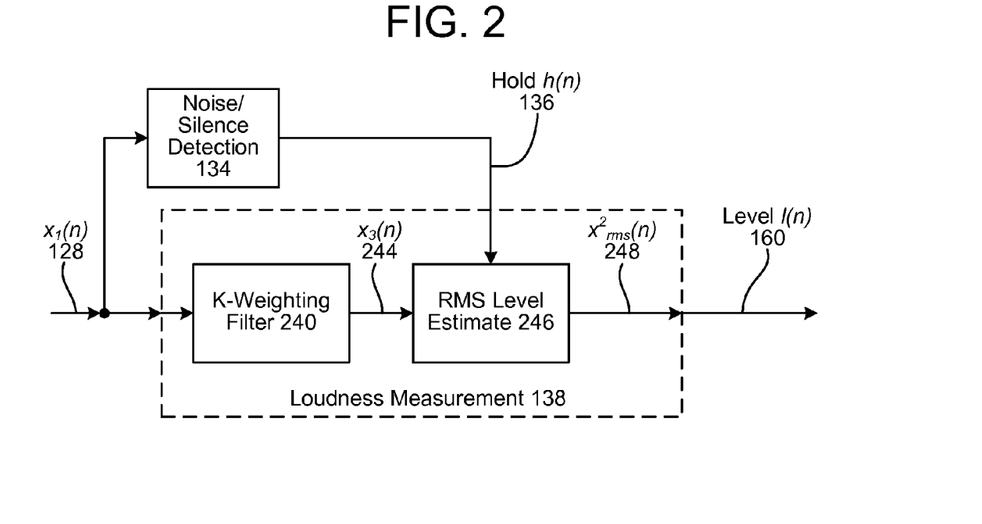
FIG. 2 is a block diagram further illustrating components of the loudness measurement block in FIG. 1.

FIG. 1 includes a noise/silence detection block 134 and a loudness measurement block 138, which are illustrated in more detail in FIG. 2. The noise/silence detection block 134 receives the audio signal $x_1(n)$ 128. If the level of the audio material conveyed by the audio signal $x_1(n)$ 128 falls below a threshold value, a hold signal h(n) 136 output by the noise/silence detection block 134 is set to a state corresponding to there being silence, noise, or some other quiet interlude in the audio material. If the level of the audio material conveyed by the audio signal $x_1(n)$ 128 is above the threshold value, the hold signal $h(n)$ 136 output is set to a state corresponding to there being substantive audio content.

The noise/silence detection block 134 may use a variety of techniques to extract the features of the audio material. Noise and silence detection may be performed with sample-by-sample processing or block-by-block processing.

A first technique is modulation measurement estimate to detect when the audio signal $x_1(n)$ 128 is dominated by noise. A modulation measurement estimate is based on the ratio between the acoustic envelope based on maxima of the audio signal and the "floor" of the signal corresponding to minima of the audio signal. If this ratio exceeds a threshold, a determination may be made that there is substantive audio content. If the ratio is below the threshold, a determination may be made that the signal $x_1(n)$ 128 is dominated by noise. For sample-by-sample processing, an envelope may be obtained by a fast-attack and slow-release (FA-SR) filter, and the floor may be obtained by a slow-attack and fast-release (SA-FR) filter. These filters act on the peak signal of the incoming audio $x_1(n)$ 128, and therefore, the ratio may be calculated for each sample moment. For block-by-block processing, the FA-SR and SA-FR filters act on the block energy, and therefore, the ratio may be calculated for a block of samples. Although either may be used, block processing is more robust than the sample-by-sample processing.

A second technique is based on monitoring the "zero" crossing rate in a waveform of the audio signal $x_1(n)$ 128. A rate of zero crossings is a rate at which the waveform crosses back-and-forth from positive to negative (and vice-versa). The rate may determine for a fixed period (e.g., a block of audio samples, sampled over a period of one second). A high rate of zero crossings is an indicator of noise. If the rate of zero crossings for a block of audio samples exceeds a threshold value, a determination may be made that the signal $x_1(n)$ 128 is dominated by noise. If the rate of zero crossings for the block of audio samples is below the threshold, a determination may be made that there is substantive audio content.

A third technique is measuring the "energy" of the audio signal $x_1(n)$ 128 based on the waveform envelope. If the energy falls below a threshold, a determination may be made that the audio material conveyed in the signal $x_1(n)$ 128 corresponds to silence or quiet. If the energy is above the threshold, a determination may be made that the signal $x_1(n)$ 128 substantive audio content.

These techniques may be used individually or in combination, and other techniques to detect noise and/or silence may be added. For example, the default state of the hold signal $h(n)$ 136 may correspond to there being substantive audio, with the hold signal changing if one or more of the techniques indicating that the signal $x_1(n)$ 128 is dominated by noise or corresponds to silence/quiet.

Figure 3:
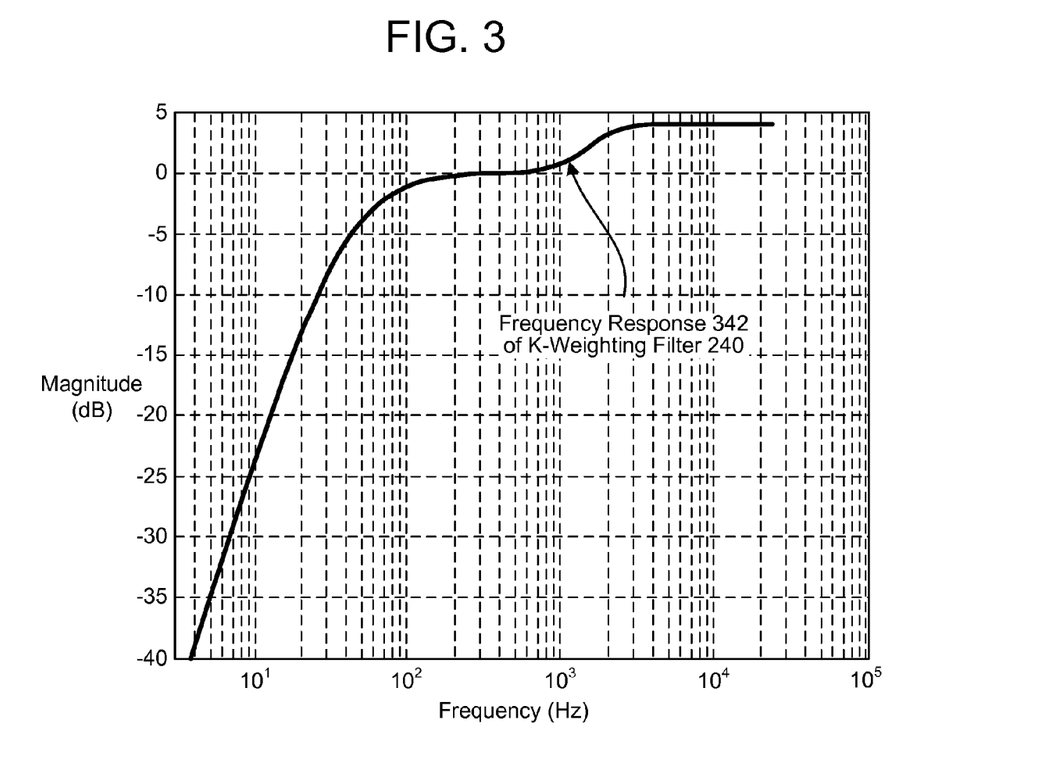
FIG. 3 illustrates the frequency response of a filter included in the loudness measurement element.

The audio signal $x_1(n)$ 128 is also input into a K-weighting filter 240 of the loudness and measurement block 138. A frequency response 342 of the K-weighting filter 240 is illustrated in FIG. 3. The frequency response 342 is derived from psychoacoustic analysis of how human being perceive loudness at different frequencies. The frequency response 342 results in the subjective perception of equal loudness across the audible spectrum (e.g., 20 Hz to 20 kHz) for input signals having a same magnitude. Application of the K-weighting filter 240 to the audio signal $x_1(n)$ 128 produces an audio signal $x_3(n)$ 244 having an equal perceived/subjective loudness contour across the audible spectrum.

The audio signal $x_3(n)$ 244 and the hold signal $h(n)$ are input into an root mean square (RMS) level estimate block 246. The root mean square is a statistical measure of the magnitude of a varying quantity. If the hold signal $h(n)$ 136 output is set to a state corresponding to there being substantive audio content, the RMS level estimate block 246 calculates a level estimate $x^2_{rms}(n)$ 248 based on equation [1]:

$$(x_{rms}(n))^2 = (1-k) \cdot (x_{rms}(n-1))^2 + k \cdot (x_3(n))^2 \quad [1]$$

where the factor "k" is calculated based on equation [2]:

$$k = 1 - \exp\left(\frac{-2.2}{fs \cdot t}\right) \quad [2]$$

The value "t" is an attack time constant and release time constant in seconds, such as 0.1 seconds. The value "fs" is the sampling rate in unit Hertz. The value $x_{rms}(n-1)$ is the RMS level resulting from applying equation [1] to the previous sample of the audio signal.

In the alternative to $x^2_{rms}(n)$ being the output of the RMS level estimate block 246, the square root of equation [1] may instead be used as the output. However, taking the square root is a computational burden, such that it is computationally more efficient to use the squared value.

The origins of Equation [2] and the associated values can be understood from the underlying system transfer function. Referring to Equation [1], the value $[x_3(n)]^2$ may be defined as the input $x(n)$ to a linear system and the value $[x_{rms}(n)]^2$ may be defined as the output $y(n)$ of the linear system. Then the linear system transfer function is:

$$H(z) = Y(z)/X(z) = k/[1-(1-k)z^{-1}] \quad [2.1]$$

which is a low-pass filter with the step response of $$y(n) = 1-(1-k)^n \text{ for } x(n)=1, n \geq 1 \quad [2.2]$$

The time constant $\tau$ is the time it takes a system to reach $(1-1/e)$ of its final value, i.e.:

$$y(\tau \times fs) = 1-(1-k)^{(\tau \times fs)} = 1-1/e \quad [2.3]$$

$$1-k = e^{-1/(\tau \times fs)}, \quad [2.4]$$

Therefore, $$k = 1-e^{-1/(\tau \times fs)} = 1-\exp(-1/(\tau \times fs)) \quad [2.5]$$

in which $\tau$ is of the unit seconds and fs is of the unit Hertz.

The attack time constant may be defined for the system based on the rise time for the step response to go from 10% to 90% of its final value. Based on this rise time for the step response, $$0.1 = 1-(1-k)^{(\tau 1 \times fs)}, \quad [2.6]$$

$$0.9 = 1-(1-k)^{(\tau 2 \times fs)}, \quad [2.7]$$

Substituting Equation [2.4] into Equations [2.6] and [2.7] results in:

$$\exp(-\tau 1/\tau) = 0.9 \quad [2.8]$$

$$\exp(-\tau 2/\tau) = 0.1 \quad [2.9]$$

Then applying the division for the above two equations results in:

$$\exp((\tau 2-\tau 1)/\tau) = 9, \quad [2.10]$$

Therefore, $(\tau 2-\tau 1)/\tau = \ln(9)$, i.e., $\tau 2-\tau 1 = \ln(9) \times \tau$. So, the attack time $t = \tau 2 - \tau 1 = \ln(9) = \tau = 2.197\tau \approx 2.2\tau$, resulting in:

$$\tau = t/2.2 \quad [2.11]$$

The $\tau$ is the time constant of the step response, and the t is the attack time. From this, Equation [2] may be obtained by substituting Equation [2.11] into Equation [2.5].

According to psychoacoustics, an RMS level is a fairly accurate representation of how people perceive subjective loudness. Alternative ways of measuring the loudness level, such as methods based on signal peaks, do not correlate as accurately with human perception.

If the hold signal h(n) 136 output by the noise/silence detection block 134 is set to a state corresponding to there being silence, noise, or some other quiet interlude in the audio material, the RMS level estimate 246 freezes the level update, continuing to output the last level estimate $x^2_{rms}(n)$ 248 that occurred before the state of the hold signal h(n) 136 changed.

In a loudness learning and balancing system for a single channel (e.g., system 112 in FIG. 1), the RMS level $x^2_{rms}(x)$ 248 equals the level l(n) 160 output by the loudness measurement block 138.

Figure 4:
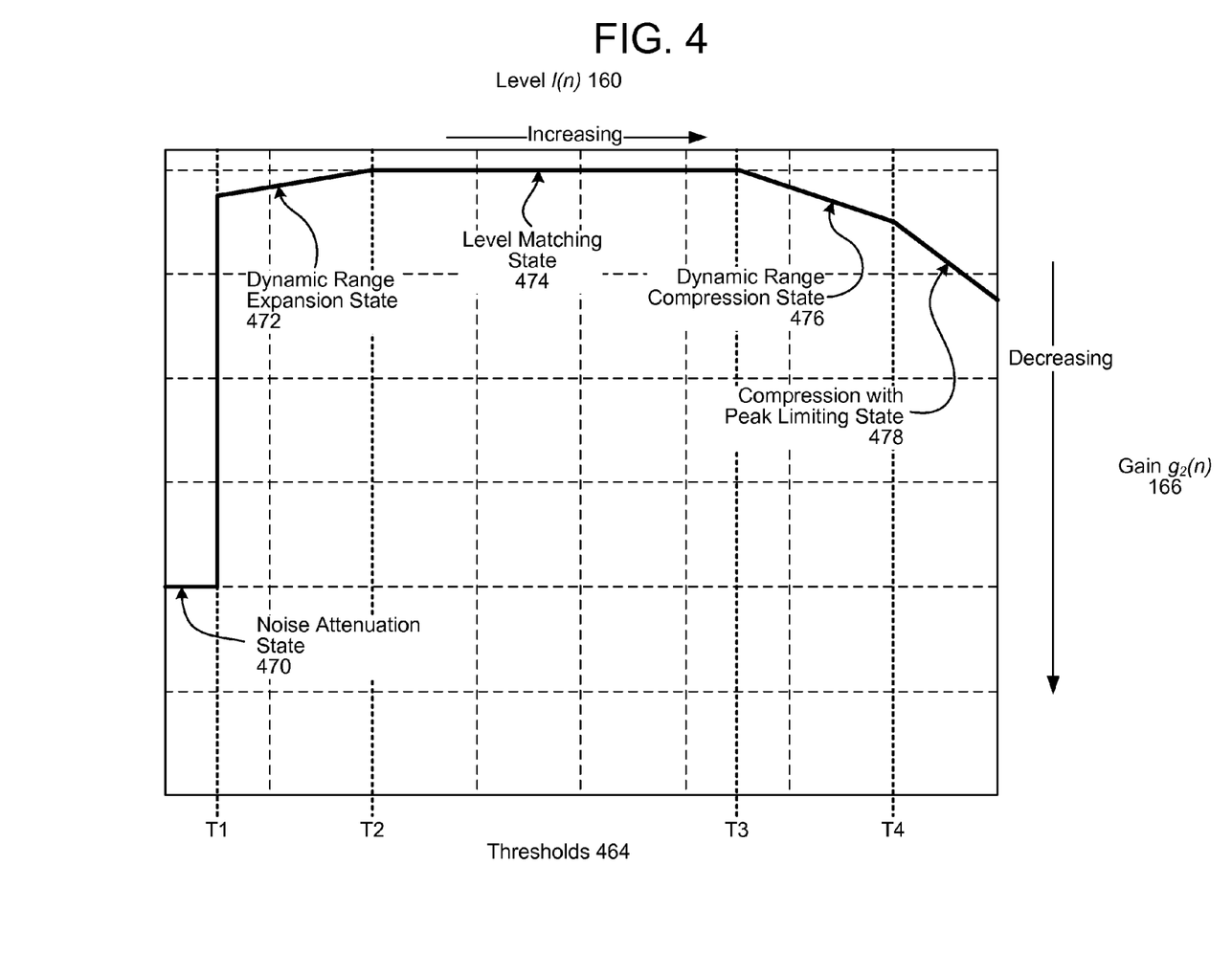
FIG. 4 illustrates a relationship between a gain value output by an adaptive compressor and expander of the system, a plurality of thresholds, and an input loudness level.

FIG. 4 illustrates a relationship between a gain value $g_2(n)$ 166 output by the adaptive compressor and expander 162, a plurality of thresholds 464, and an input loudness level l(n) 160. The adaptive compressor and expander block 162 provides an adaptive gain. As illustrated, there are four thresholds applied to the input level l(n) 160 received from the loudness measurement block 138. The order from smallest threshold to largest threshold is: T1≤T2<T3<T4<0.0 dB. The particular thresholds and attenuation levels illustrated in FIG. 4 are examples and other values may be used. A different number of thresholds may also be used.

The adaptive compressor and expander block 162 as illustrated by the example in FIG. 4 works as follows. When the input loudness level l(n) 160 is below a threshold T1 (dB), the gain $g_2(n)$ 166 is set to reduce the amplitude of the output audio signal to be 0.01 that of the input audio signal (corresponding to a reduction of −40 dB) so as to reduce (attenuate) the low level components and noise in the audio signal (i.e., noise attenuation state 470). When the input loudness level l(n) 160 is between thresholds T1 and T2 (i.e., the input audio is too soft), the block 162 works as an expander to variably set the gain $g_2(n)$ 166 to increase level changes in the input audio signal so as to produce larger level changes in the output audio signal across the T1 to T2 loudness range (i.e., increase the dynamic range in dynamic range expansion state 472). When the input loudness level l(n) 160 is between thresholds T2 and T3 (i.e., the input audio is of normal level), the gain $g_2(n)$ 166 is set so that the output level of the audio signal matches the input level of the audio signal, setting the gain $g_2(n)$ 166 to unity (1.0) corresponding to 0.0 dB (level matching state 474). When the input loudness level l(n) 160 is between thresholds T3 and T4 (i.e., the input audio is loud), the block 162 works as a compressor, variably setting the gain $g_2(n)$ 166 to reduce the change of input audio signal level to produce a smaller change in the output level (i.e., reduce the dynamic range in dynamic range compression state 476). When the input loudness level l(n) 160 is larger than threshold T4 (i.e., the input audio is "hot," where "hot" corresponds to the output almost being saturated), the block 162 works as a limiter. Operating as a limiter, the gain $g_2(n)$ 166 is adaptively set so that input audio levels that produced the loudness level l(n) value above the T4 threshold are reduced more sharply than when the block 162 operates as a compressor, with the result being all input levels (i.e., amplitude peaks) above an acoustic envelope limit are reduced to a constant output level (i.e., compression with peak limiting state 478).

Figure 5A:
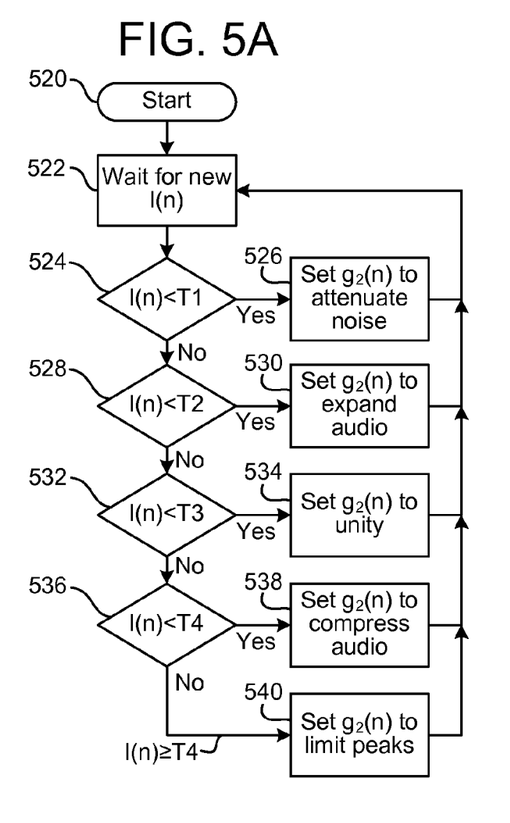
FIGS. 5A and 5B illustrate examples of a method by which the adaptive compressor and expander may set the gain value and adjust the thresholds.

FIG. 5A illustrates a process that may be used by the adaptive compressor and expander 162 to set the gain $g_2(n)$ 166 in conjunction with FIG. 4. From starting point 520, the process waits (522) for a change in the input loudness level l(n) 160. In the alternative, the process may execute periodically based on the sampling rate (fs in equation [2]), executing for each new sample.

The input loudness level l(n) 160 is compared (524) with the threshold T1. If the level l(n) is less than T1 (524 "Yes"), then the output gain $g_2(n)$ 166 is set (526) to attenuate the low level components and noise in the audio signal (e.g., the reduction of −40 dB). Otherwise (524 "No"), the input loudness level l(n) 160 is compared (528) with the threshold T2. If the level l(n) is less than T2 (528 "Yes"), then the output gain $g_2(n)$ 166 is set (530) to expand the audio signal. Otherwise (528 "No"), the input loudness level l(n) 160 is compared (532) with the threshold T3. If the level l(n) is less than T3 (532 "Yes"), then the output gain $g_2(n)$ 166 is set (534) to unity. Otherwise (532 "No"), the input loudness level l(n) 160 is compared (536) with the threshold T4. If the level l(n) is less than T4 (536 "Yes"), then the output gain $g_2(n)$ 166 is set (540) to compress the audio signal. Otherwise (536 "No") the input loudness level l(n) 160 must be greater than or equal to the threshold T2, so the output gain $g_2(n)$ 166 is set (540) so that the adaptive compressor and expander block 162 operates as a limiter, reducing all input levels above the acoustic envelope limit to the constant output level.

Figure 5B:
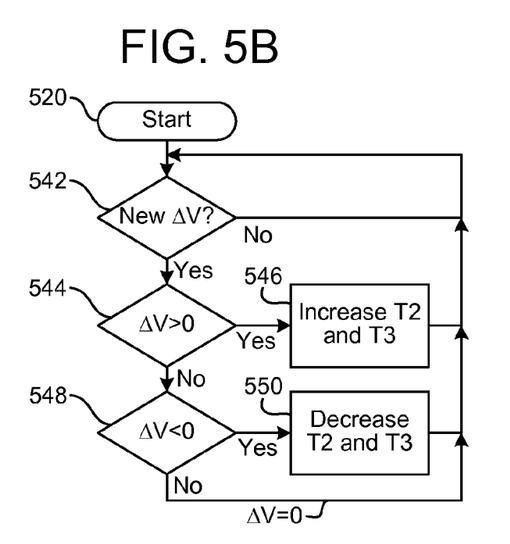

Furthermore, as illustrated by the process in FIG. 5B, the adaptive compressor and expander block 162 also monitors the tri-state ΔV preference value 132 output by the preferred volume tracking block 130, and adjusts the threshold values based on changes to the tri-state ΔV preference value 132. From the starting point 520, the process checks (542) to determine whether there is a new (i.e., change to) the ΔV preference value 132 value. If there is (542 "Yes"), a determination is made as to whether the tri-state ΔV preference value 132 is positive, negative, or equal to zero.

If the tri-state ΔV preference 132 value is a positive (544 "Yes"), this indicates that the preference is for louder sound, such that the values of T3 and T4 may be increased with respect to the most recent setting so as to have less compression effect and less level reduction, T2 may be increased with respect to the most recent settings so as to provide a greater boost to a soft input (the "boost" being provided by the dynamic range expansion state 472), and T1 may be reduced so as to have a smaller noise attenuation state 470 (Step 546). One example is to increase T3 until T3=T4, such that the block 162 transitions directly from outputting a unity gain (level matching state 474 between thresholds T2 and T3) to operating as a limiter (i.e., state 478), eliminating the dynamic range compression state 476 between thresholds T3 and T4).

If the tri-state ΔV preference value 132 is a negative (548 "Yes"), this indicates that the likely preference is for softer sound, such that the values of T3 and T4 may be reduced with respect to the most recent settings so as to have more compression effect (i.e., state 476), and T2 may be reduced with respect to the most recent setting so as to provide less boosting to input audio that is too soft (Step 550). Otherwise, the tri-state ΔV preference value 132 is zero, and there is no adjustment made to the thresholds with respect to the most recent settings.

A gain smoother block 168 may be included to reduce the variation of the gain $g_2(n)$ 166 output by the adaptive compressor and expander block 162, outputting a smoothed gain $g_3(n)$ 170. The final gain $g_3(n)$ 170 may be determined by the gain smoother 168 in accordance with equation [3]:

$$g_3(n)=\alpha*g_3(n-1)+(1-\alpha)*g_2(n) \quad [3]$$

where α is a smoothing factor between 0.0 and 1.0. The larger a is, the slower the gain tracking speed and the smoother the $g_3(n)$ curve is over time. The value $g_3(n-1)$ in Equation [3] is the gain resulting from previously applying equation [3]. The value of "n-1" may correspond to a previous discrete sample (e.g., based on the sampling rate "fs" discussed with equation [2]) or some other continuous or discrete unit of time to produce an attack/decay rate consistent with the value of α. The result is that when gain $g_2(n)$ changes, gain $g_3(n)$ gradually and smoothly rises or falls to track gain $g_2(n)$ over an interval of time based on the value of the factor α. If the factor α is small (e.g., approaching zero), the rate of change is faster and this interval is shorter. If the factor α is large (e.g., approaching 1.0), the rate of change is slower and this interval is longer.

The smoothed gain $g_3(n)$ output by the gain smoother 168 is applied to a time-delayed audio signal $x_1(n-d)$ 174 by a multiplier 176. A delay block 172 receives the audio signal $x_1(n)$ 128 from the multiplier 126, delays it by time interval "d", and outputs the time-delayed audio signal $x_1(n-d)$ 174. The delay block 172 may delay the audio signal sample-by-sample, apply a continuous time delay, etc. The delay "d" may be, for example, in a range of 8 ms to 16 ms, as this amount of delay is usually acceptable to a listener and is sufficient to set the gain $g_3(n)$. The resulting output loudness is well balanced and consistent. A "predictive" level control is provided by delaying the input signal relative to the gain control signal $g_3(n)$ in this feed-forward configuration (e.g., gain goes down before any "big bangs" in the audio material).

After applying the final gain $g_3(n)$ to the delayed input signal, a limiter 180 may be included to prevent the system output audio signal $x_{out}(n-d)$ 182 from clipping so as to avoid any artifacts, such as peaks in the audio signal with amplitudes exceeding an envelope limit that were not sufficiently attenuated by the adaptive compressor and expander 162. An example would be short spikes or bursts in the audio signal that do not produce a loudness level l(n) 160 above the T4 threshold.

Figure 6:
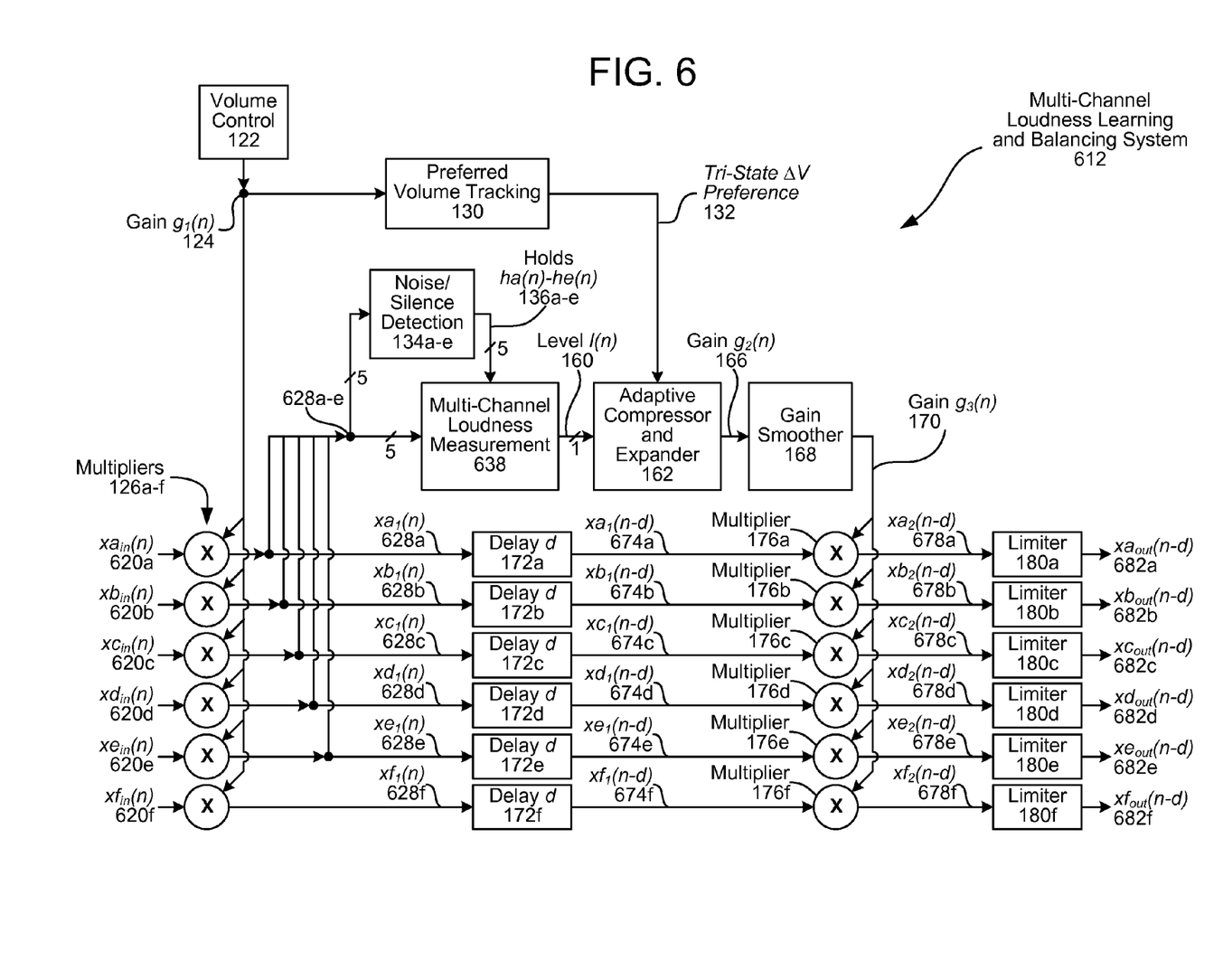
FIG. 6 is a block diagram conceptually illustrating an example of a loudness learning and balancing system for multiple audio channels.

FIG. 6 is a block diagram conceptually illustrating an example of the loudness learning and balancing system 112 scaled up to support multiple audio channels. As illustrated, the multi-channel system 612 is a "5.1" configuration, such as might be used with a "surround sound" system. The principles of this configuration maybe applied to any multiple of audio channels, such as a scaled up configuration (e.g., "7.1" surround) or down configuration (e.g., 2-channel stereo, or "2.1" channel stereo plus subwoofer).

In this example, the input signal $xa_{in}(n)$ 620a is the audio signal for a left-front channel, $xb_{in}(n)$ 620b is the audio signal for a right-front channel, $xc_{in}(n)$ 620c is the audio signal for a center-front channel, $xd_{in}(n)$ 620d is the audio signal for a left-rear "surround" channel, $xe_{in}(n)$ 620e is the audio signal for a right-rear "surround" channel, and $xf_{in}(n)$ 620f is a subwoofer low frequency effect (LFE) channel. Each of these channels will be used in the loudness and gain calculations except for the LFE channel which is excluded.

As illustrated in FIG. 6, the volume control block 122 and preferred volume tracking block 130 are the same as was discussed in connection with single channel system 112, as are the adaptive compressor and expander block 162, and the gain smoother block 168. Multiple copies of several of various blocks in the single channel system 112 are included in the multi-channel system 612. For example, each channel is provided with an input multiplier 126a-126f, a delay block 172a-172f, an output multiplier 176a-176f, and a limiter block 180a-180f. Each of the non-LFE channels (i.e., 620a-620e) is provided a noise/silence detection block 134a-134e.

Figure 7:
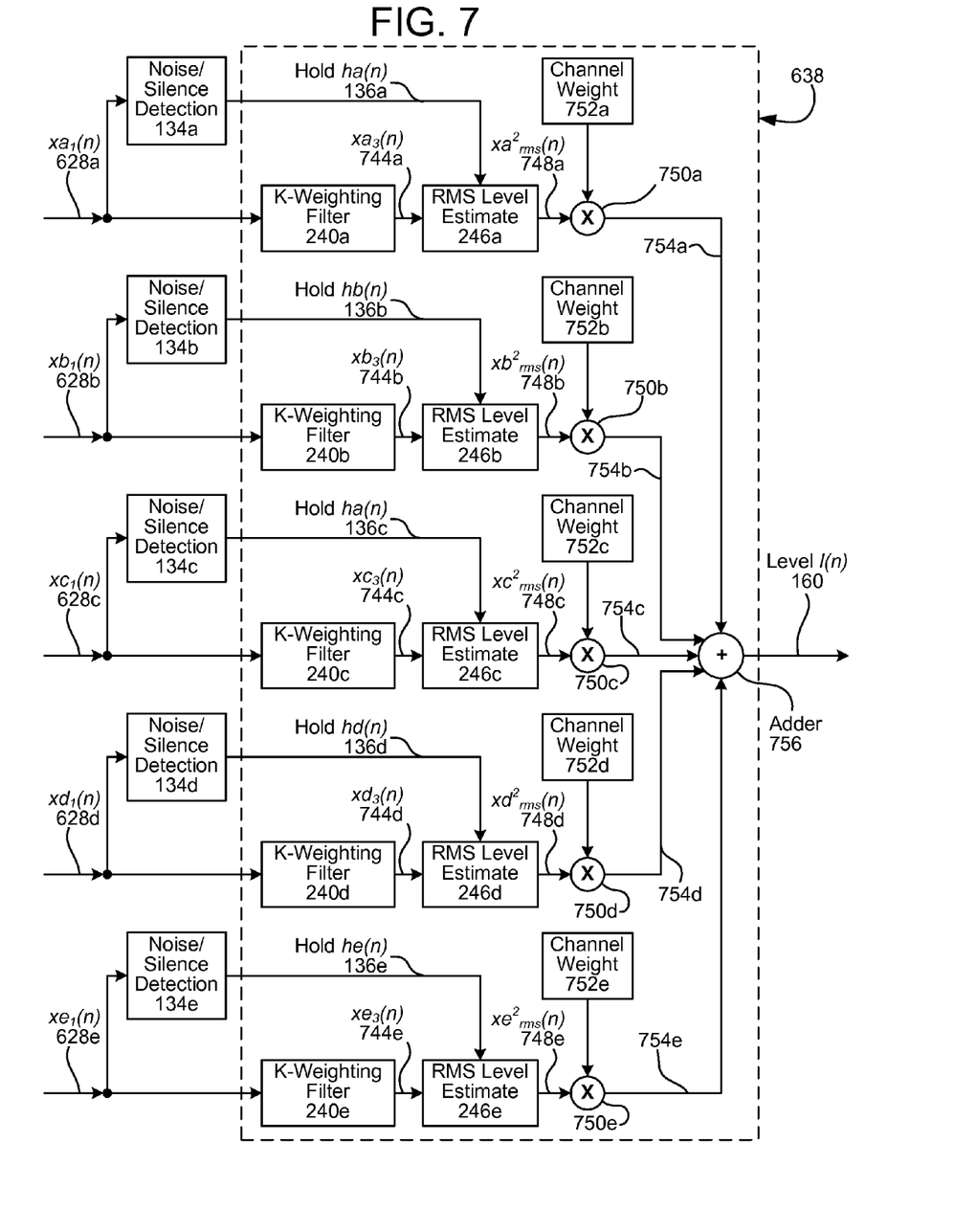
FIG. 7 is a block diagram further illustrating components of the loudness measurement block in FIG. 6.

The loudness measurement block 638 in the multi-channel configuration 638 includes additional components, as illustrated in FIG. 7. Each non-LFE channel includes a K-weighting filter 240a-240e which receives an audio signal ($xa_1(n)$ 628a to $xe_1(n)$ 628e) output by an input multiplier 126a-126e. The output of the filter ($xa_3(n)$ 744a to $xe_3(n)$ 744e) in input into a corresponding RMS level estimate block 246a-246e, which receives a hold indicator (ha(n) 136a to he(n) 136e) from a noise/silence detection block 134a-134e for that channel. In other words, up to this point, the components of the multi-channel measurement block 638 are parallel copies of the components of the loudness measurement block 138 discussed in connection with FIGS. 1, 2, and 3, with a copy of the components provided for each of the non-LFE channels.

The difference between the single-channel version of the block 138 and the multi-channel block 638 is the combining of the RMS level estimates ($xa^2_{rms}(n)$ 748a to $xe^2_{rms}(n)$ 748e) to provide a single unified loudness level l(n) 160. Each of the RMS level estimates ($xa^2_{rms}(n)$ 748a to $xe^2_{rms}(n)$ 748e) is input into a corresponding multiplier 750a-750e, which also receives a channel-specific channel weight 752a-754e. The channels are weighted to balance their contributions to the combined loudness level l(n) 160. An example of the channel weights 752a-752e is presented in Table 1:

| Channel | Left Front (a) | Right Front (b) | Center (c) | Left Rear (d) | Right Rear (e) |
|---------|----------------|-----------------|------------|---------------|----------------|
| Weight  | 1.0            | 1.0             | 1.0        | 1.41          | 1.41           |

These weights may be adjusted dynamically based on ambient acoustics. For example, the rear channel weights 752d and 752e may be increased or decreased based on the time delay and loudness settings for the rear channels in comparison to the front channels. Such settings are ordinarily configured when a surround sound system is initially set up. Such settings implicate aspects of the room acoustics and surround-sound system performance, such as differences in the efficiencies between speakers (e.g., differences in the sound intensity produced from different speakers resulting from an audio signal having a same frequency and magnitude), as well as psychoacoustic aspects of how a person perceives loudness in a room setting.

The weighted RMS level estimates 754a-754e output by the multipliers 750a-750e are combined together by an adder/summer 756, with the combine result output as the loudness level l(n) 160. The loudness level l(n) 160 is then input into the adaptive compressor and expander block 162 as discussed above with the single channel system 112, with the resulting gain $g_2(n)$ 166 input into the gain smoother 168. The smoothed gain $g_3(n)$ 170 output by the gain smoother 168 is applied the output multipliers 176a-176f for each of the channels, multiplying a respective delayed audio signal ($xa_1(n-d)$ 674a to $xf_1(n-d)$ 6740 by the gain $g_3(n)$ 170. The output of each multiplier 176a-176f ($xa_2(n-d)$ 678a to $xf_2(n-d)$ 6780 is then input into a channel-specific limiter 180*a*-180*f*, producing an output audio signal $xa_{out}$ (n−d) 682*a* to $xf_{out}$(n−d) 682*f*.

The examples illustrated in FIGS. 6 and 7 are designed for the applications when system users do not have facilities to separately adjust the front and rear channels' settings. Therefore, the obtained gain $g_3(n)$ 170 is applied to all the channels (FIG. 6) so as to retain the original sound image. For the applications when users have the facilities to separately adjust the front and rear channels' settings or would like to adjust the thresholds or reference levels for front and rear channels differently, two stereo (Left/Right, Left rear/Right rear) and one mono (Center channel) preference-based loudness learning and balancing systems may be instead used to provide the benefits of the system for the 5.1 surround sound. Similarly, for the 7.1 surround sound, three stereo (Left/Right, Left surround/Right surround, Left surround rear/Right surround rear) and one mono (Center channel) preference-based loudness learning and balancing systems may be used so that the gains $g_3(n)$ 170 are different for front, center, surround, and surround rear sound.

In summary, the loudness learning and balancing systems 112 and 612 provide several advantages over existing Dynamic Range Compression (DRC) systems. Among them, the systems 112 and 612 include a capacity to learn and track a preferred volume, can offer the listener a consistent and balanced sonic experience with good audio quality due to the improved accuracy provided by the loudness measurement, are better able to avoid the "breathing" problem and avoid over-amplification "pumping" problems due to the noise/silence detection while maintaining the output audio signal above the noise floor, can adaptively reduce low-level noise (due to including the attenuation for input loudness levels less than the threshold T1), and will work for any number of channels.

With digital audio recordings and streams, the systems 112 and 612 will work at any sampling rate, such as 48 kHz, 44.1 kHz, 32 kHz, 24 kHz, 22.05 kHz, 16 kHz, 11.025 kHz, and 8 kHz. The architectures of the systems 112 and 612 can be used to support any number of audio channels, such as, mono, stereo, 5.1 channels, 7.1 channels, etc.

Figure 8:
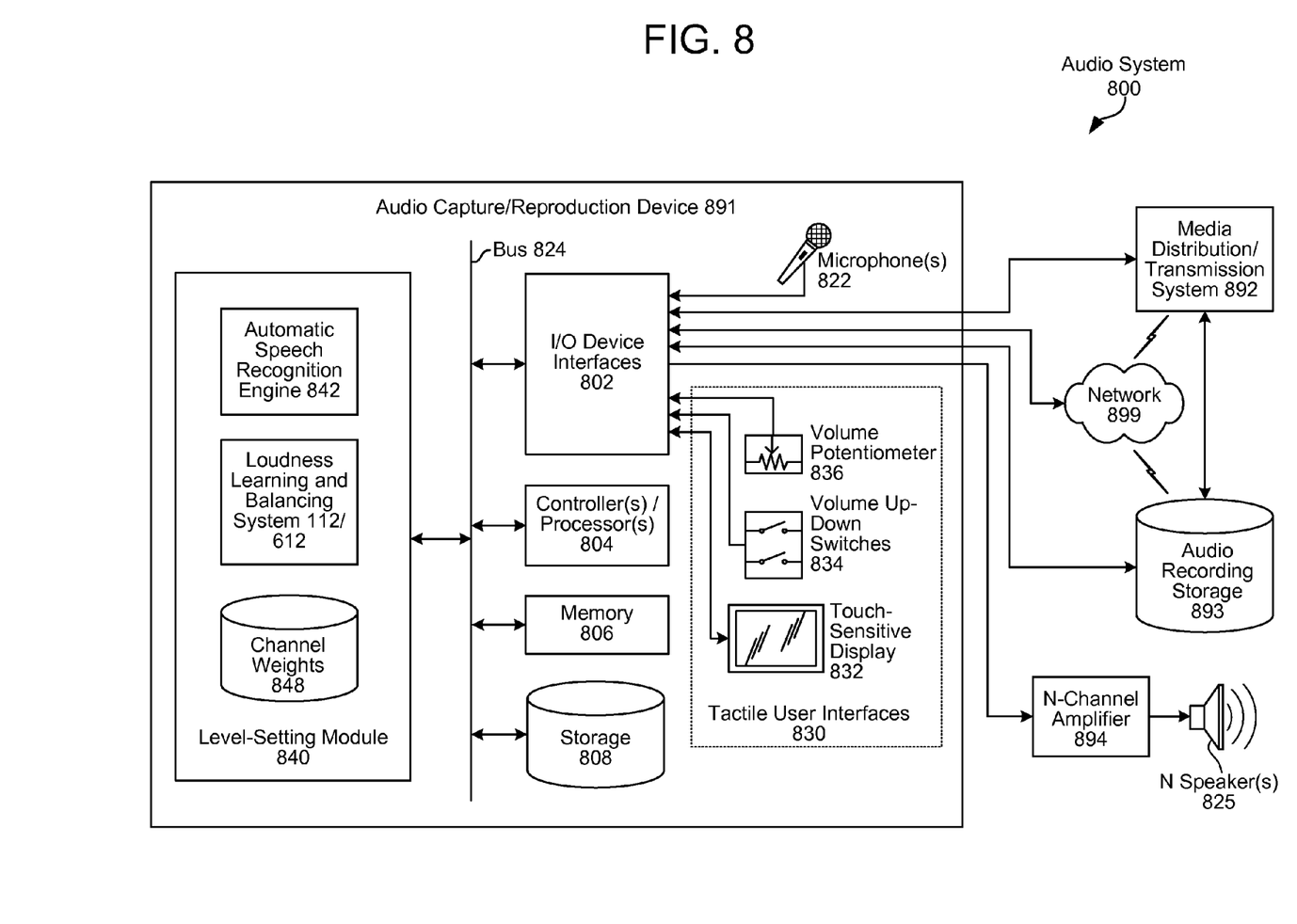
FIG. 8 is a block diagram conceptually illustrating example components of a system utilizing a loudness learning and balancing system.

FIG. 8 is a block diagram conceptually illustrating example components of a system 800 utilizing a loudness learning and balancing system 112/612. In operation, the system 800 may include computer-readable and computer-executable instructions that reside in the memory 806 and/or storage 808 of an audio capture/reproduction device 891 including the loudness learning and balancing system 112/612, as will be discussed further below.

As illustrated in FIG. 8, the system 800 may include microphone(s) 822 to capture audio material and audio recording storage 893 to store the resulting audio material, with the loudness learning and balancing system 112/612 adjusting the stored levels/dynamic range of the captured audio material. The system 800 may also include an N-channel amplifier 894 and associated speaker(s) 825, with the loudness learning and balancing system 112/612 adjusting the levels/dynamic range of the audio material output by the speaker(s) 825. The system may also include a media distribution/transmission system 892, which may distribute audio material stored in audio recording storage 893. The media distribution/transmission system 892 may also provide the audio capture/reproduction device 891 with audio media, with the loudness learning and balancing system 112/612 adjusting the levels/dynamic range of the audio material for playback. Other audio media sources may also be included.

The audio capture/reproduction device 891 may connect to the various media sources, distribution systems, and/or media storage systems directly or via one or more networks 899. The connections between these various media sources, distribution systems, and/or media storage systems may be in a digital format, an analog format, or a combination thereof. All or portions of the various media sources, distribution systems, and/or media storage systems of the system 800 may be included in a single device such as integrated within the audio capture/reproduction device 891, or broken up across multiple devices.

The audio capture/reproduction device 891 includes one or more user interfaces by which the gain $g_1(n)$ 124 of the volume control 122 may be set. Examples of such user interfaces include tactile user interfaces 830 and non-tactile user interfaces such as the automatic speech recognition engine 842 of the level-setting module 840. Examples of tactile user interfaces 830 include a touch-sensitive display 832 with may provide a graphical user interface (GUI), up-down switches 834, and a rotary or slide potentiometer 836.

The various components of the system may connect to the loudness learning and balancing system 112/612 directly, or through input/output device interfaces 802 via a bus 824. If the loudness learning and balancing system 112/612 is digital and the received audio material is analog, digital-to-analog conversion may be included within the input/output device interfaces 802 or as a front-end process of the loudness learning and balancing system 112/612. Likewise, if the loudness learning and balancing system 112/612 is digital and the output is to be analog, analog-to-digital conversion may be included within the input/output device interfaces 802 or as a back-end process of the loudness learning and balancing system 112/612.

The address/data bus 824 may convey data among components of the audio capture/reproduction device 891. As already noted, each component within the device 891 may also be directly connected to other components in addition to (or instead of) being connected to other components across the bus 824.

The device 891 may include one or more controllers/processors 802, that may each include a central processing unit (CPU) and/or a digital signal processor (DSP) for processing data and computer-readable instructions, and a memory 806 for storing data and instructions. The memory 806 may include volatile random access memory (RAM), non-volatile read only memory (ROM), non-volatile magnetoresistive (MRAM) and/or other types of memory. The device 891 may also include a data storage component 808, for storing data and controller/processor-executable instructions (e.g., instructions to perform the processes and calculations performed by the loudness learning and balancing system 112/612 and/or the automatic speech recognition engine 842). The data storage component 808 may include one or more non-volatile storage types such as magnetic storage, optical storage, solid-state storage, etc. The device 891 may also be connected to removable or external non-volatile memory and/or storage (such as a removable memory card, memory key drive, networked storage, etc.) through the input/output device interfaces 802.

Computer instructions for operating the device 891 and its various components may be executed by the controller(s)/processor(s) 8004, using the memory 806 as temporary "working" storage at runtime. The computer instructions may be stored in a non-transitory manner in non-volatile memory 806, storage 808, or an external device. Alternatively, some or all of the executable instructions may be embedded in hardware or firmware in addition to or instead of software.

A variety of components may be connected through the input/output device interfaces 802, and a variety of communication protocols may be supported. For example, the input/output device interfaces 802 may also include an interface for an external peripheral device connection such as universal serial bus (USB), FireWire, Thunderbolt or other connection protocol. The input/output device interfaces 802 may also include a connection to one or more networks 899 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc. In addition to wired and/or built-in arrangements, the microphone(s) 822 and/or speaker(s) 825 may connect wirelessly, such an arrangement where the microphone(s) 822, amplifier 894, and/or speaker(s) 825 are part of a headset connected to the device 891 via one of these wireless connections. Through the network 899, the system 800 may be distributed across a networked environment.

The audio capture/reproduction device 891 includes the level-setting module 840. The module 840 may include the automatic speech recognition (ASR) engine 842 used by the user to communicate volume level changes, the loudness learning and balancing system 112/612, and the channel weights 848 discussed in connection with Table 1. In a multi-channel configuration, if the output of the RMS level estimate blocks 246 outputs loudness values in the digital domain, the then the channel weights 752 may be a set of numeric values. If the RMS level estimate block 246 outputs loudness values in the analog domain, the channel weights 752 may correspond to equivalent analog levels, such as potentiometers providing voltages that serve as the channel weights 752.

Multiple devices 891/892/894 and media storages 893 may be employed in a single audio system 800. In such a multi-device system, components in different device may perform different aspects of the loudness learning and balancing system 112/612 and/or ASR 842. Multiple devices may include overlapping components. The components of the system 800 as illustrated in FIG. 8 are exemplary, and may be included in a stand-alone device or may be included, in whole or in part, as a component of a larger device or system.

The concepts disclosed herein may be applied within a number of different devices and computer systems, including, for example, general-purpose computing systems, digital signal processing, multimedia set-top boxes, televisions, stereos, radios, digital media playback devices such as "smart" phones, MP3 players, tablet computers, and personal digital assistants (PDAs), audio distribution and broadcasting system, and audio recording systems.

The disclosed examples are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, digital signal processing, and audio processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media. In addition, one or more of the ASR engine 842 and components of the loudness learning and balancing system 112/612 may be implemented as firmware or as a state machine in hardware. For example, the adaptive compressor and expander 162 may be implemented as a state machine on an application specific integrated circuit (ASIC), a digital signal processor (DSP), a field programmable gate array (FPGA), or some combination thereof.

As used in this disclosure, the term "a" or "one" may include one or more items unless specifically stated otherwise. Further, the phrase "based on" is intended to mean "based at least in part on" unless specifically stated otherwise.

What is claimed is:

1. A method adaptively adjusting audio output levels in a multi-channel audio system, comprising:
    receiving a first plurality of audio signals including a first left-channel audio signal and a first right-channel audio signal;
    receiving a first gain specified by a volume control of the audio system;
    applying the first gain to the first plurality of audio signals, producing a volume-adjusted plurality of audio signals including a volume-adjusted left-channel audio signal and a volume-adjusted right-channel audio signal;
    delaying the volume-adjusted plurality of audio signals, producing a delayed volume-adjusted plurality of audio signals;
    determining a first volume change corresponding to a difference between the first gain at a first time and the first gain at a second time, wherein the second time is after the first time and the first volume change indicates a decrease in volume;
    comparing a plurality of volume changes including the first volume change and at least one past volume change to determine that a majority of the plurality of volume changes correspond to increases of the first gain;
    determining a left-channel loudness level of the volume-adjusted left-channel audio signal at the second time;
    determining a right-channel loudness level of the volume-adjusted right-channel audio signal at the second time;
    combining the left-channel loudness level and the right-channel loudness level, producing a combined loudness level;
    determining that the combined loudness level is to be boosted to expand dynamic range as a result of the majority of the plurality of volume changes corresponding to increases of the first gain;
    determining a second gain to boost the combined loudness level;

applying the second gain to the delayed volume-adjusted plurality of audio signals to create a second plurality of audio signals; and outputting the second plurality of audio signals.

2. The method of claim 1, further comprising:

determining that the volume-adjusted left-channel audio signal has fallen below a threshold energy level corresponding to silence at a third time, the third time being after the second time and the volume-adjusted left-channel audio signal having been above the threshold energy level at the second time;

determining that the volume-adjusted right-channel audio signal has fallen below the threshold energy level at the third time, the third time being after the second time and the volume-adjusted left-channel audio signal having been above the threshold energy level at the second time; and maintaining the second gain while the volume-adjusted left-audio channel signal and the volume-adjusted right-channel audio channel signal remain below the threshold energy level.

3. A computing device comprising:

a processor;

a memory including instruction operable to be executed by the processor to perform a set of actions to configure the at least one processor to:

determine a first gain applied to a first audio signal;

store first audio data representing the first audio signal for a first period of time;

generate a delayed first audio signal based at least in part on the first audio data after the first period of time;

determine a first loudness level of the first audio signal;

determine a first plurality of changes between adjacent pairs of values of the first gain over a second period of time, the first plurality of changes including a first change, where changes from a larger first gain to a smaller first gain constitute a decrease to the first gain, and changes from a smaller first gain to a larger first gain constitute an increase to the first gain;

determine that a majority of the first plurality of changes occurring over the second period of time correspond to decreases to the first gain;

determine a second gain after the first change based at least in part on the first loudness level and based at least in part on the majority of changes to the first gain being decreases to the first gain; and determine a dynamic range of the delayed first audio signal based at least in part on the second gain.

4. The computing device of claim 3, wherein the instructions to determine the second gain after the first change configure the processor to:

determine the second gain to attenuate the delayed first audio signal while the first loudness level is below a first threshold level;

determine the second gain to expand the dynamic range of the delayed first audio signal while the first loudness level is above the first threshold level and below a second threshold level;

determine the second gain to maintain the dynamic range of the delayed first audio signal while the first loudness level is above the second threshold level and below a third threshold level;

determine the second gain to compress the dynamic range of the delayed first audio signal while the first loudness level is above the third threshold level; and decrease the second threshold level and the third threshold level after the first change to the first gain occurring during the first period of time results in the majority of the first plurality changes to the first gain over time being decreases.

5. The computing device of claim 4, wherein the instructions to determine the second gain after the first change further configure the processor to:

determine the second gain to compress the dynamic range and limit a magnitude of peak energy levels of the delayed first audio signal while the first loudness level is above fourth threshold level, the fourth threshold level being greater than or equal to the third threshold level.

6. The computing device of claim 4, wherein the instructions further configure the processor to:

determine a second plurality of changes between adjacent pairs of values of the first gain over a third period of time, the second plurality of changes including a second change, the second time period at least partially overlapping the first time period;

determine that a majority of the second plurality of changes occurring over the third period of time correspond to increases to the first gain;

determine the second gain to attenuate the delayed first audio signal while the first loudness level is below a first threshold level;

determine the second gain to expand the dynamic range of the delayed first audio signal while the first loudness level is above the first threshold level and below a second threshold level;

determine the second gain to maintain the dynamic range of the delayed first audio signal while the first loudness level is above the second threshold level and below a third threshold level;

determine the second gain to compress the dynamic range of the delayed first audio signal while the first loudness level is above the third threshold level; and increase the second threshold level and the third threshold level after the second change to the first gain occurring during the third period of time results in the majority of the plurality changes to the first gain over time being increases.

7. The computing device of claim 3, wherein the instructions to determine the first loudness level configure the processor to:

filter the first audio signal using a stored loudness model that adjusts energy levels of the first audio signal based at least in part on how human beings perceive loudness at a first frequency and at a second frequency, the first frequency and the second frequency being different frequencies in the audible spectrum where loudness is perceived differently, the stored loudness model configured to produce an equal loudness at the first frequency and the second frequency, producing a filtered first audio signal; and determine the first loudness level as a first root mean square level of the filtered first audio signal.

8. The computing device of claim 3, wherein the first gain is also applied to a second audio signal and the instructions further configure the processor to:

store second audio data representing the second audio signal for the first period of time;

generate a delayed second audio signal based at least in part on the second data after the first period of time;

determine a second loudness level of the second audio signal; and determine a dynamic range of the delayed second audio signal based at least in part on the second gain, wherein the second gain is further based on the second loudness level.

9. The computing device of claim 3, wherein the instructions further configure the processor to:

determine that the first audio signal is above a threshold energy level at a first time;

determine that the first audio signal has fallen below the threshold energy level at a second time, the second time being after the first time; and determine that the first audio signal has risen back above the threshold energy level at a third time, the third time being after the second time, wherein the instructions to determine the second gain:

determine the second gain at the first time based on the first loudness level determined for the first audio signal at the first time, determine the second gain between the second and the third time based the first loudness level determined for the first audio signal at the first time, and determine the second gain at the third time based on the first loudness level determined for the first audio signal at the third time.

10. The computing device of claim 3, wherein the instructions further configure the processor to:

determine a ratio between energy level maxima and energy level minima of the first audio signal;

determine that the ratio is above a modulation threshold at a first time;

determine that the ratio has fallen below the modulation threshold at a second time, the second time being after the first time; and determine that the ratio has risen back above the modulation threshold at a third time, the third time being after the second time, wherein the instructions to determine the second gain:

determine the second gain at the first time based on the first loudness level determined for the first audio signal at the first time, determine the second gain between the second and the third time based on the first loudness level determined for the first audio signal at the first time, and determine the second gain at the third time based on the first loudness level determined for the first audio signal at the third time.

11. The computing device of claim 3, wherein the instructions further configure the processor to:

determine a first rate of zero crossings for a first block of samples of the first audio signal at a first time;

determine that the first rate of zero crossings is below a rate threshold;

determine a second rate of zero crossings for a second block of samples of the first audio signal at a second time, the second time being after the first time and the second block of samples following the first block of samples;

determine that the second rate of zero crossings is above the rate threshold;

determine a third rate of zero crossings for a third block of samples of the first audio signal at a third time, the third time being after the second time and the third block of samples following the second block of samples; and determine that the first rate of zero crossings is below the rate threshold, wherein the instructions to determine the second gain:

determine the second gain at the first time based on the first loudness level determined for the first audio signal at the first time, determine the second gain between the second and the third time based the first loudness level determined for the first audio signal at the first time, and determine the second gain at the third time based on the first loudness level determined for the first audio signal at the third time.

12. The computing device of claim 3, wherein the instructions further configure the processor to:

smooth changes to the second gain to generate a third gain in accordance with:

$$g_3(n) = \alpha * g_3(n-1) + (1-\alpha) * g_2(n)$$

where α is a smoothing factor between 0.0 and 1.0, $g_2(n)$ is the second gain, $g_3(n)$ is the third gain, and $g_3(n-1)$ is a prior third gain, wherein the instructions to determine the dynamic range of the delayed first audio signal based at least in part on the second gain determine the dynamic range based at least in part on the third gain determined in part from the second gain.

13. A method comprising:

determining a first gain applied to a first audio signal;

storing first audio data representing the first audio signal for a first period of time;

generating a delayed first audio signal based at least in part on the first audio data after the first period of time;

determining a first loudness level of the first audio signal;

determining a first plurality of changes between adjacent pairs of values of the first gain over a second period of time, the first plurality of changes including a first change, where changes from a larger first gain to a smaller first gain constitute a decrease to the first gain, and changes from a smaller first gain to a larger first gain constitute an increase to the first gain;

determining that a majority of the first plurality of changes occurring over the second period of time correspond to decreases to the first gain;

determining a second gain after the first change based at least in part on the first loudness level and based at least in part on the majority of changes to the first gain being decreases to the first gain; and determining a dynamic range of the delayed first audio signal based at least in part on the second gain.

14. The method of claim 13, wherein determining the second gain after the first change comprises:

determining the second gain to attenuate the delayed first audio signal while the first loudness level is below a first threshold level;

determining the second gain to expand the dynamic range of the delayed first audio signal while the first loudness level is above the first threshold level and below a second threshold level;

determining the second gain to maintain the dynamic range of the delayed first audio signal while the first loudness level is above the second threshold level and below a third threshold level;

determining the second gain to compress the dynamic range of the delayed first audio signal while the first loudness level is above the third threshold level; and decreasing the second threshold level and the third threshold level after the first change to the first gain occurring during the first period of time results in the majority of the first plurality changes to the first gain over time being decreases.

15. The method of claim 13, further comprising:
determining a second plurality of changes between adjacent pairs of values of the first gain over a third period of time, the second plurality of changes including a second change, the second time period at least partially overlapping the first time period;
determining that a majority of the second plurality of changes occurring over the third period of time correspond to increases to the first gain;
determining the second gain to attenuate the delayed first audio signal while the first loudness level is below a first threshold level;
determining the second gain to expand the dynamic range of the delayed first audio signal while the first loudness level is above the first threshold level and below a second threshold level;
determining the second gain to maintain the dynamic range of the delayed first audio signal while the first loudness level is above the second threshold level and below a third threshold level;
determining the second gain to compress the dynamic range of the delayed first audio signal while the first loudness level is above the third threshold level; and
increasing the second threshold level and the third threshold level after the second change to the first gain occurring during the third period of time results in the majority of the plurality changes to the first gain over time being increases.

16. The method of claim 13, wherein determining the first loudness level comprises:
filtering the first audio signal using a stored loudness model that adjusts energy levels of the first audio signal based at least in part on how human beings perceive loudness at a first frequency and at a second frequency, the first frequency and the second frequency being different frequencies in the audible spectrum where loudness is perceived differently, the stored loudness model configured to produce an equal loudness at the first frequency and the second frequency, producing a filtered first audio signal; and
determining the first loudness level as a first root mean square level of the filtered first audio signal.

17. The method of claim 13, wherein the first gain is also applied to a second audio signal and the method further comprises:
storing second audio data representing the second audio signal for the first period of time;
generating a delayed second audio signal based at least in part on the second data after the first time period;
determining a second loudness level of the second audio signal; and
determining a dynamic range of the delayed second audio signal based at least in part on the second gain,
wherein the second gain is further based on the second loudness level.

18. The method of claim 13, further comprising:
determining that the first audio signal is above a threshold energy level at a first time;
determining that the first audio signal has fallen below the threshold energy level at a second time, the second time being after the first time; and
determining that the first audio signal has risen back above the threshold energy level at a third time, the third time being after the second time,
wherein:
determining the second gain at a first time is based on the first loudness level determined for the first audio signal at the first time,
determining the second gain between the second time and the third time continues to be based on the first loudness level determined for the first audio signal at the first time, and
determining the second gain at the third time is based on the first loudness level determined for the first audio signal at the third time.

19. The method of claim 13,
determining a ratio between energy level maxima and energy level minima of the first audio signal;
determining that the ratio is above a modulation threshold at a first time;
determining that the ratio has fallen below the modulation threshold at a second time, the second time being after the first time; and
determining that the ratio has risen back above the modulation threshold at a third time, the third time being after the second time,
wherein:
determining the second gain at the first time is based on the first loudness level determined for the first audio signal at the first time,
determining the second gain between the second and the third time continues to be based on the first loudness level determined for the first audio signal at the first time, and
determining the second gain at the third time is based on the first loudness level determined for the first audio signal at the third time.

20. The method of claim 13,
determining a first rate of zero crossings for a first block of samples of the first audio signal at a first time;
determining that the first rate of zero crossings is below a rate threshold;
determining a second rate of zero crossings for a second block of samples of the first audio signal at a second time, the second time being after the first time and the second block of samples following the first block of samples;
determining that the second rate of zero crossings is above the rate threshold;
determining a third rate of zero crossings for a third block of samples of the first audio signal at a third time, the third time being after the second time and the third block of samples following the second block of samples; and
determining that the first rate of zero crossings is below the rate threshold,
wherein:
determining the second gain at the first time is based on the first loudness level determined for the first audio signal at the first time,
determining the second gain between the second and the third time continues to be based the first loudness level determined for the first audio signal at the first time, and
determining the second gain at the third time is based on the first loudness level determined for the first audio signal at the third time.

* * * * *